(12) United States Patent
Wein et al.

(10) Patent No.: US 7,269,815 B2
(45) Date of Patent: Sep. 11, 2007

(54) MODIFYING A DESIGN TO REVEAL THE DATA FLOW OF THE DESIGN IN ORDER TO CREATE A MORE FAVORABLE INPUT FOR BLOCK PLACEMENT

(75) Inventors: Enno Wein, Livermore, CA (US); Vahagn Poghosyan, San Jose, CA (US); Uma Panda, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 24 days.

(21) Appl. No.: 10/862,729

(22) Filed: Jun. 7, 2004

(65) Prior Publication Data

US 2005/0183054 A1 Aug. 18, 2005

Related U.S. Application Data

(60) Provisional application No. 60/545,205, filed on Feb. 17, 2004.

(51) Int. Cl.
*G06F 17/50* (2006.01)
(52) U.S. Cl. .......................................... 716/18; 716/12
(58) Field of Classification Search .................... 716/4, 716/7, 8, 12, 18
See application file for complete search history.

(56) References Cited

U.S. PATENT DOCUMENTS

| | | | |
|---|---|---|---|
| 6,295,636 B1 * | 9/2001 | Dupenloup | 716/18 |
| 6,421,818 B1 * | 7/2002 | Dupenloup et al. | 716/18 |
| 6,598,215 B2 * | 7/2003 | Das et al. | 716/12 |
| 6,651,235 B2 * | 11/2003 | Dai et al. | 716/7 |
| 6,799,309 B2 * | 9/2004 | Dhanwada et al. | 716/8 |
| 6,836,877 B1 * | 12/2004 | Dupenloup | 716/18 |
| 6,938,232 B2 * | 8/2005 | Saito et al. | 716/8 |
| 2003/0229874 A1 * | 12/2003 | Saito et al. | 716/8 |
| 2005/0076319 A1 * | 4/2005 | Chow et al. | 716/10 |

* cited by examiner

*Primary Examiner*—Stacy A Whitmore
(74) *Attorney, Agent, or Firm*—Bever, Hoffman & Harms, LLP; Patrick T. Bever

(57) ABSTRACT

A system is employed for modifying a hierarchical description of a design to reveal the data flow of the design. The modified design provides a more favorable input for block placement. In one embodiment, the modifications includes any one of or a combination of moving hard macros to a higher level of the hierarchical description of the design, flattening modules that are bigger than a threshold, and/or flattening star blocks. Up to three clustering strategies are employed as part of the flattening process, including name-based clustering, external connection based clustering and gate clustering.

20 Claims, 9 Drawing Sheets

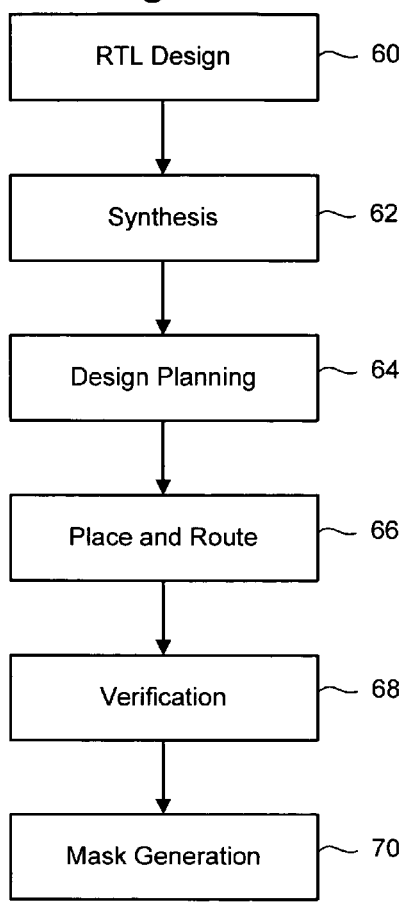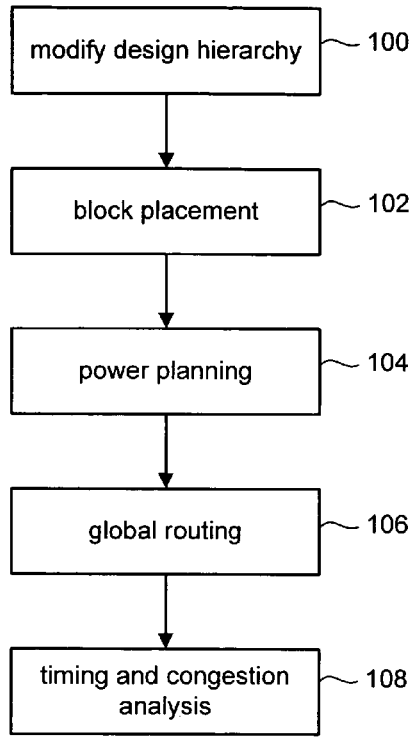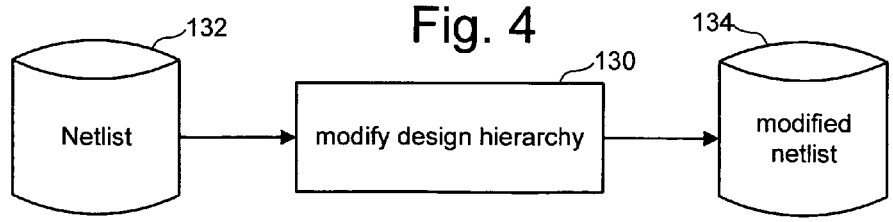

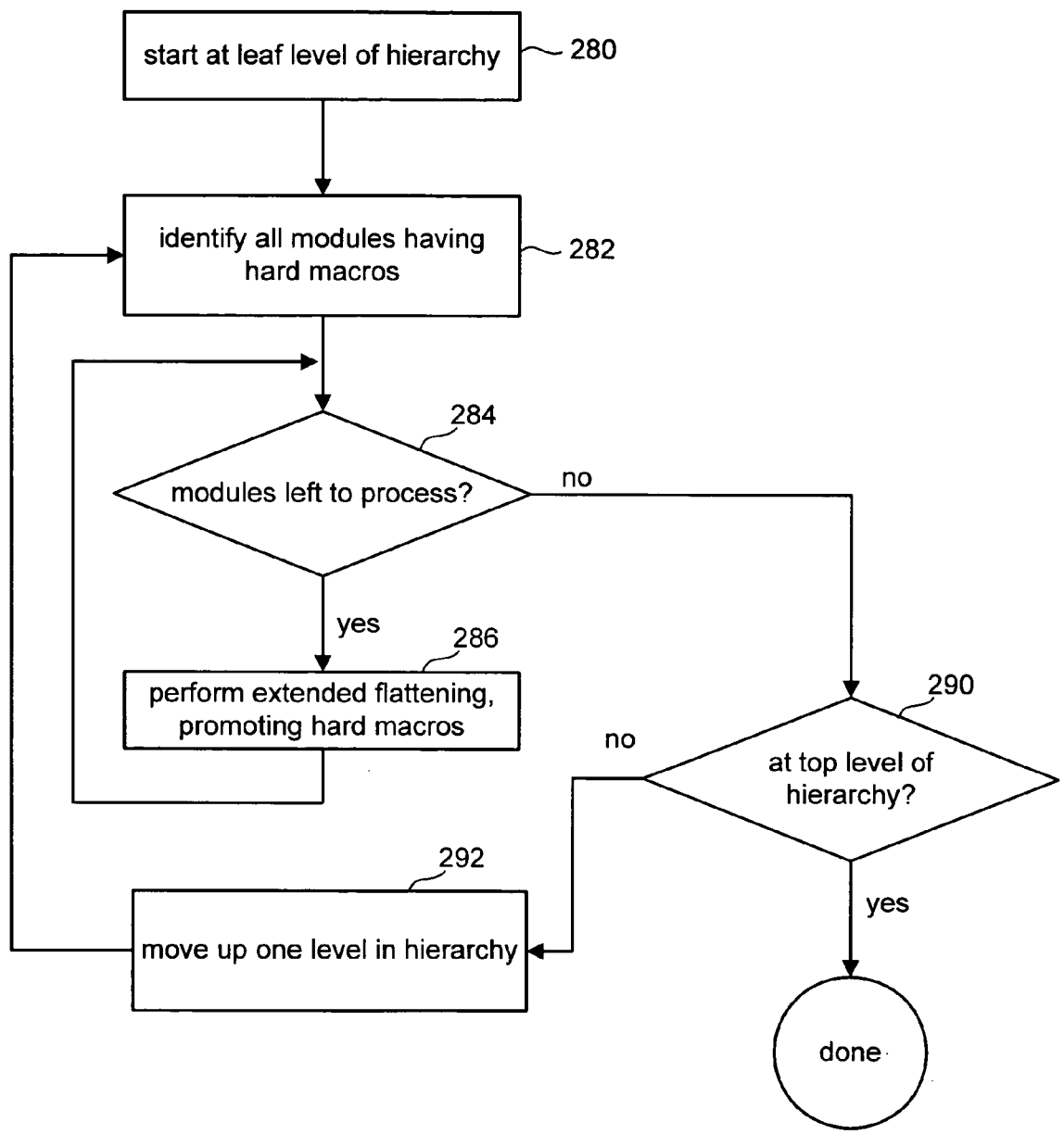

MODIFYING A DESIGN TO REVEAL THE DATA FLOW OF THE DESIGN IN ORDER TO CREATE A MORE FAVORABLE INPUT FOR BLOCK PLACEMENT

This application claims the benefit of U.S. Provisional Application No. 60/545,205, "Data flow Based Automated Design Planning," filed on Feb. 17, 2004, incorporated herein by reference in its entirety.

BACKGROUND OF THE INVENTION

1. Field of the Invention

The present invention relates to technology for design planning.

2. Description of the Related Art

The use of electronic design automation (EDA) tools has become commonplace for the design of high density integrated circuits. The current design flow used by many engineers includes defining a Register Transfer Level (RTL) description of the design, performing logic synthesis from the RTL to generate a netlist, placing and routing the components in the netlist, and performing verification and analysis of the placed and routed design to verify that the end result performs as intended.

Many logic synthesis tools will create a netlist in a hierarchical format. However, many placement tools require the netlist to be flat. Therefore, many design processes will utilize a tool that will flatten the hierarchical netlist. However, some designs have more components than a placement tool can reasonably handle. To overcome the restrictions regarding the number of components that can be placed by an automatic placement tool, typical design process will have human engineers manually place hard macros and then the remaining gates will be clustered based on connectivity. That is, gates that are connected together are grouped as a single object (clusters). The automatic placement tool then places the clusters around the hard macros. Note that a hard macro is a usually larger object that typically is fixed in size and shape. Hard macros typically cannot be changed. By replacing the many gates with a smaller number of clusters (groups of gates), the placement task is simplified. Subsequently, the placement tool is run within each cluster to place the gates within the clusters. Historically, when the human engineer manually places the hard macros, the hard macros are situated at the edges of the integrated circuit. For example, FIG. 1 shows an integrated circuit 10 after manual placement of hard macros 20, 22, 24 and 26. As illustrated, hard macros 20, 22, 24 and 26 are positioned near the edge/perimeter 28 of integrated circuit 10.

The problem with the above-described process is that much space on the integrated circuit is wasted due to poor placement of components. To remain competitive in a globally competitive marketplace, a maker of integrated circuits needs to be able to include as much logic on an integrated circuit as possible. Therefore, there is a need to improve the ability to place objects on an integrated circuit in a manner that more efficiently uses the available area of the integrated circuit.

SUMMARY OF THE INVENTION

The present invention, roughly described, pertains to a system for modifying a hierarchical description of a design to the reveal data flow of the design. The modified description provides a more favorable input for placement of objects. In one embodiment, the modifications includes any one of or any combination of moving hard macros to a higher level of the hierarchical description of the design, flattening modules that are bigger than a threshold, and/or flattening star blocks. Up to three clustering strategies are employed as part of the flattening process, including name-based clustering, external connection based clustering and gate clustering.

One example implementation includes accessing the description of the design (e.g. netlist or other type of description) and modifying that description to reveal the data flow of the design. The description can be accessed by reading a file (or other unit(s) of information) on a storage device or reading the description via a network or other communication device/medium, etc.

Every design contains data flow, as represented by the original RTL (Register Transfer Level) description, module diagram or graph. In many design processes, the RTL design is used to create a hierarchical netlist. Typically, the data flow is not apparent in the netlist. Various embodiments of the present invention modify the netlist (or other type of description) to reveal all or a portion of the data flow of the design. Through automated hierarchical morphing, this method restructures the hierarchy to bring out the data flow more clearly than the original, logical structure. The flow of data between macroscopic entities (e.g., hard macros such as adders, multipliers, Finite-State-Machines (FSMs), and memories) should determine the placement of these pieces, together with their size. In other words, a finished fine-grain plan of a design or block contains hundreds to thousands of functional pieces that are connected to each other, representing the flow of data between them.

The modification to a netlist (or other type of description) to reveal all or a portion of the data flow of the design allows for automatic (as compared to manual) and/or improved placement of hard macros using wire length, size, timing, routing information, pin placement, aspect ratio, and other physical information. Automated block placement using data flow and size estimates of logic sections determines a favorable placement of hard and soft blocks, minimizing wire lengths and other cost functions. Finally, incremental detailing (or "micro"-modifications) enhances local routability. The placement can then be passed on to a silicon virtual prototyping tool and/or a place and route tool.

The present invention can be accomplished using hardware, software, or a combination of both hardware and software. The software used for the present invention is stored on one or more processor readable storage devices including hard disk drives, CD-ROMs, DVDs, optical disks, floppy disks, tape drives, RAM, ROM, flash memory or other suitable storage devices. In alternative embodiments, some or all of the software can be replaced by dedicated hardware including custom integrated circuits, gate arrays, FPGAs, PLDs, and special purpose processors. In one embodiment, software implementing the present invention is used to program one or more processors. The one or more processors can be in communication with one or more storage devices (hard disk drives, CD-ROMs, DVDs, optical disks, floppy disks, tape drives, RAM, ROM, flash memory or other suitable storage devices), peripherals (printers, monitors, keyboards, pointing devices) and/or communication interfaces (e.g. network cards, wireless transmitters/receivers, etc.).

These and other objects and advantages of the present invention will appear more clearly from the following description in which the preferred embodiment of the invention has been set forth in conjunction with the drawings.

BRIEF DESCRIPTION OF THE DRAWINGS

FIG. 2 is a flow chart describing one embodiment of a design flow.

FIG. 3 is a flow chart describing one embodiment of a process for design planning.

FIG. 4 is a block diagram illustrating the input and output of the design modification process.

FIG. 8 is a flow chart describing one embodiment of a process for promoting hard macros.

DETAILED DESCRIPTION

Figure 1:
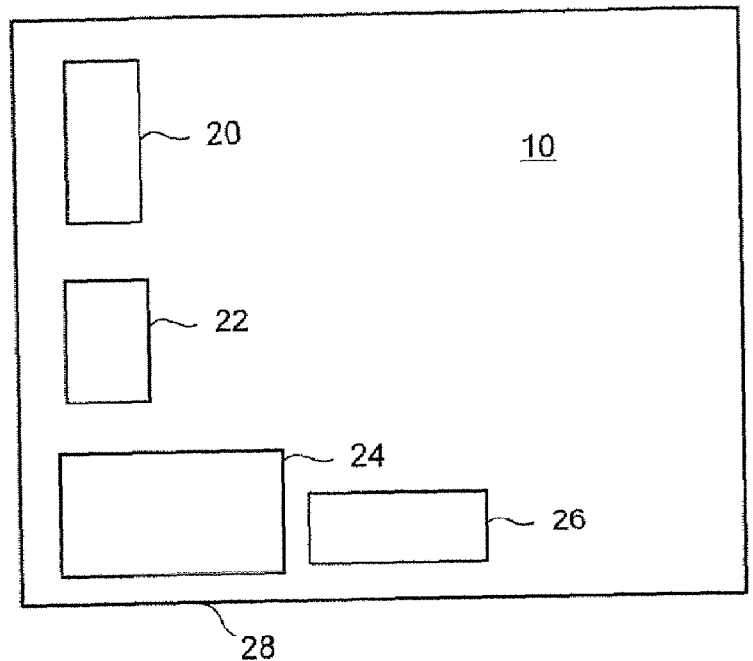
FIG. 1 depicts an example of an integrated circuit 10 after manual placement of hard macros.

The invention is illustrated by way of example, and not by way of limitation, in the figures of the accompanying drawings in which like references indicate similar elements. It should be noted that references to an embodiment in this disclosure are not necessarily the same embodiment, and such references mean at least one.

In the following description, various aspects of the present invention will be described. However, it will be apparent to those skilled in the art that the present invention may be practiced with only some or all of the aspects of the present disclosure. For purposes of explanation, specific numbers, materials and configurations are set forth in order to provide a thorough understanding of the invention. However, it will be apparent to one skilled in the art that the present invention may be practiced without all of the specific details. In other instances, well known features are omitted or simplified in order not to obscure the present invention.

Various embodiments will be described as multiple discreet steps in turn, in a manner that is most helpful in understanding the present invention. However, the order of this description should not be construed as to imply that these operations are necessarily order dependent.

Embodiments of the present invention pertain to a system for modifying a hierarchical description of a design in order to the reveal data flow of the design. The modified description provides a more favorable input for automated block placement.

Automated block placement under various constraints (e.g., size, aspect ratio, port placement) yields a placement of hard macros which is unlike that of manual floor plans. Manual floor plans typically have their macros placed along the edges with the pins facing inward. This is done to overcome limitations of backend tools (especially placement), which are usually limited in the complexity of placeable area and work best if the placeable area is fairly rectangular with few fringes and certainly no "islands." Automated block placement, which utilizes the benefits of the present invention, places objects according to the data flow and is much more aggressive. Such automated placement includes placing hard macros in the center (or interior) of an integrated circuit, rather than along the edges, following the macroscopic data flow of the design.

In this scenario, it is preferable that the gate placement follows the same data flow as envisioned by the block placement process. In designs with a high number of macros (covering a high percentage of placeable area), this is realized by the strong "seeding" through the hard macro pins and locations. In designs with reduced hard macro percentage, extra data may be passed from block to gate placement in order to accomplish the proper seeding. This is done by defining regions which are used to steer placement and then removed. In designs with loose gates or identified star blocks (described below) that contain no further hierarchy, gates are clustered into meaningful sub-modules which can be floor planned efficiently.

In order to make the data flow visible and predominant, typically the original hierarchical structure is changed, since it contains the data flow only implicitly. As an example, memories, adders, and finite state machines are typically mixed within logic modules, which are buried somewhat lower in the hierarchy. These hierarchical levels are identified and removed in order to make the data flow visible.

During the process of flattening, hierarchical impurities (e.g., individual gates mixed with functional macros) have a negative impact since they increase the number of pieces and reduce the grain size towards the gate level, bringing into consideration too many individual wires that are not representative of the data flow and "cloud the vision" by cluttering the scenario. To remedy that, those gates are collected and combined into new macros based on their connectivity. This is referred to as "clustering." The newly created pieces blend in and become part of the data flow, making them useful items in the process of placement.

The final result of the hierarchical morphing process is a structure representing the original design that can consist of hundreds to thousands of macro-items connected according to the data flow.

There are two issues which affect this process. First, modules that connect to not only a few essential elements, but also to a high number of neighboring elements, prohibit ideal or optimal placement. These elements are referred to as star blocks based on their appearance when connectivity to the elements around them is viewed graphically. Star blocks pull all connected elements closely to them, defeating an otherwise present but less strongly connected data flow. In other words, in a scenario in which "everything connects to everything" good placement may be hard to determine.

The second negative influence is high fan-out signals. Like star blocks, they disturb the predominance of data flow and overshadow it. High fanout signals are part of the function of the design and the scenario cannot be changed unless synthesis is used to "clone" the sources. However, that would need to be done on the macro level which is not currently an accepted design technique (it introduces issues for scan, formal verification, and the like), therefore those signals can be treated with a lower weight in placement.

Star blocks can often be eliminated by simple flattening, after doing some internal grouping and clustering based on the external connectivity of the block. The individual content pieces of a star block that represent the different branches of connectivity to other blocks are identified, grouped and then the hierarchy of the star block is removed, leaving only normal connectivity and data flow. The result is that instead of pulling potentially unrelated functions close together, the star block content is spread around according to the actual data flow and no longer has a negative influence on the placement cost function.

It is desirable that hard macros (memories, etc.) are present at the top level when placing the block. In most designs, hierarchy levels are somewhat impure and the hard macros are usually surrounded by individual gates that need to be sorted and clustered according to their connectivity to the hard macros. Those clusters form the blocks that are directly connected to the macros and facilitate connectivity of the macro to the rest of the design. They are typically placed very closely (e.g., directly adjacent) to the macro.

The above summarized modifying of a hierarchical description of a design is performed, in some embodiments, as part of the design process for an integrated circuit. However, the modifying of a hierarchical description of a design can also be performed as part of other processes. FIG. 2 is a flowchart describing one embodiment of a process for designing an integrated circuit that can utilize the technology described herein for modifying a description of a design. In step 60 of FIG. 2, one or more engineers create an RTL design. In one embodiment, the RTL design is in a Verilog format. In step 62, a gate-level netlist is generated/synthesized based on the RTL design. In one embodiment, a gate-level netlist is a hierarchical netlist. In one implementation, a hierarchical netlist includes a hierarchical design tree, which is a created by "sub-module" relationships. The root node corresponds to the design and child nodes correspond to sub-modules. Leaf nodes of the design tree correspond to hard macros and/or standard cells (assuming there are no pads and soft macros). A leaf node is a module that contains no hierarchical sub-module.

The term "data flow" used in this document refers to the flow of data in the RTL design. Modules are nodes on the design tree described above. Some of the modules are hierarchical and have internal structure. That is, they can be decomposed into sub-modules. Other modules are leaf level and, usually (but not always) are standard (atomic) functions like ADD, etc. and cannot be expanded further. There are many forms for a netlist or other types of descriptions of a design that can be generated in step 62. The present invention can be used with many different variations of these forms of descriptions of a design.

In step 64, design planning is performed. In some embodiments, design planning is performed after synthesis step 62. In other embodiments, design planning can be performed in parallel to synthesis step 62. The design planning phase includes determining where to place hard macros, I/O buffers and other blocks (including clusters). In addition, in some embodiments, design planning includes partitioning the design to smaller partitions. This is done because place-and-route tools may have limited capability of the number of components that they can place and route.

In step 66, the design is placed and routed. In step 68, design is verified to ensure that the final design functions as intended. In step 70, a mask is generated for manufacture of the design.

FIG. 3 is a flowchart describing one embodiment of a process for performing design planning (see step 64 of FIG. 2). In step 100 of FIG. 3, the design hierarchy is modified. That is, the netlist (or other description of the design) will be modified to create a more favorable input for block placement. In step 102, block placing will be performed. In one embodiment, block placement includes placing hard macros and clusters of gates. The block-placement process can use wire length, size, timing information, routing information, pin placement, aspect ratio and physical information to place the appropriate blocks. This is a preliminary placement in that the actual placement of individual gates will not be finalized until the place-and-route step 66 of FIG. 2. In step 104, power planning is performed. That is, a determination is made of the placement and routing of ground and power rails. In step 106, global routing and port placement is performed. Step 106 includes routing centers of clusters to centers of other clusters to determine whether the floor plan is routable. In addition, step 106 includes determining where to place ports. In step 108, timing and congestion analysis is performed. Step 108 includes determining how many lines will be in a given area of the chip to determine if it is possible to route all the lines. In addition, a timing analysis will be performed to determine propagation times to verify that the place and route (see step 66) will work properly.

Note that the above discussion assumes that the entire design is developed as one partition. However, if the design is very large, the EDA tools may not be able to handle the entire design. Thus, the design will be divided into partitions. Each partition may be separately subjected to all or a subset of steps 62-68 and the entire design will be verified at the end. In other embodiments, the partitioning will be performed as part of the design planning process (step 64 of FIG. 2). In that case, the process of FIG. 3 will be performed separately for each separate partition followed by performing the method of FIG. 3 on the overall design. The process of partitioning is well known in the art.

FIG. 4 provides more information about the step of modifying the design hierarchy (step 100 in FIG. 3). FIG. 4 shows software 130 for modifying the design (e.g. modifying the netlist). This software receives a netlist 132 as an input, modifies that netlist and outputs a modified netlist 134. More details of the modifications performed will be discussed below. In one embodiment, software 130 resides on and is used to program a computing device. Examples of a suitable computing device include a workstation running an operating system from Sun Microsystems, Linux or a Windows-based operating system. The software can also be performed by a personal computer, mini computer, mainframe computer, handheld computing device, mobile computing device, etc. A typical computing device implementing the present invention will include one or more processors, one or more storage devices in communication with the processors, one or more communication interfaces in communication with the processors, and one or more peripherals in communication with the processors. Typically, the software implementing the present invention is stored on one or more of the storage devices and is used to program one or more of the processors. Both the netlist and modified netlist is likely to be stored on the storage devices or accessed via a network (wired or wireless) connection. Examples of storage devices include RAM, ROM, hard disk drives, floppy disk drives, optical drives, flash memory, other non-volatile memory, etc. Examples of communication interfaces include wired network cards, wireless network interfaces, etc. Examples of peripheral devices include keyboards, pointing devices (e.g. mouse), monitors, touch pads, printers, etc. In one embodiment, the software residing on a hard disk drive is copied to memory and used to program one or more processors to perform the functions described herein. In other embodiments, the present invention can be implemented on a special-purpose computer or on custom-designed hardware specific to perform the invention described herein.

Figure 5:
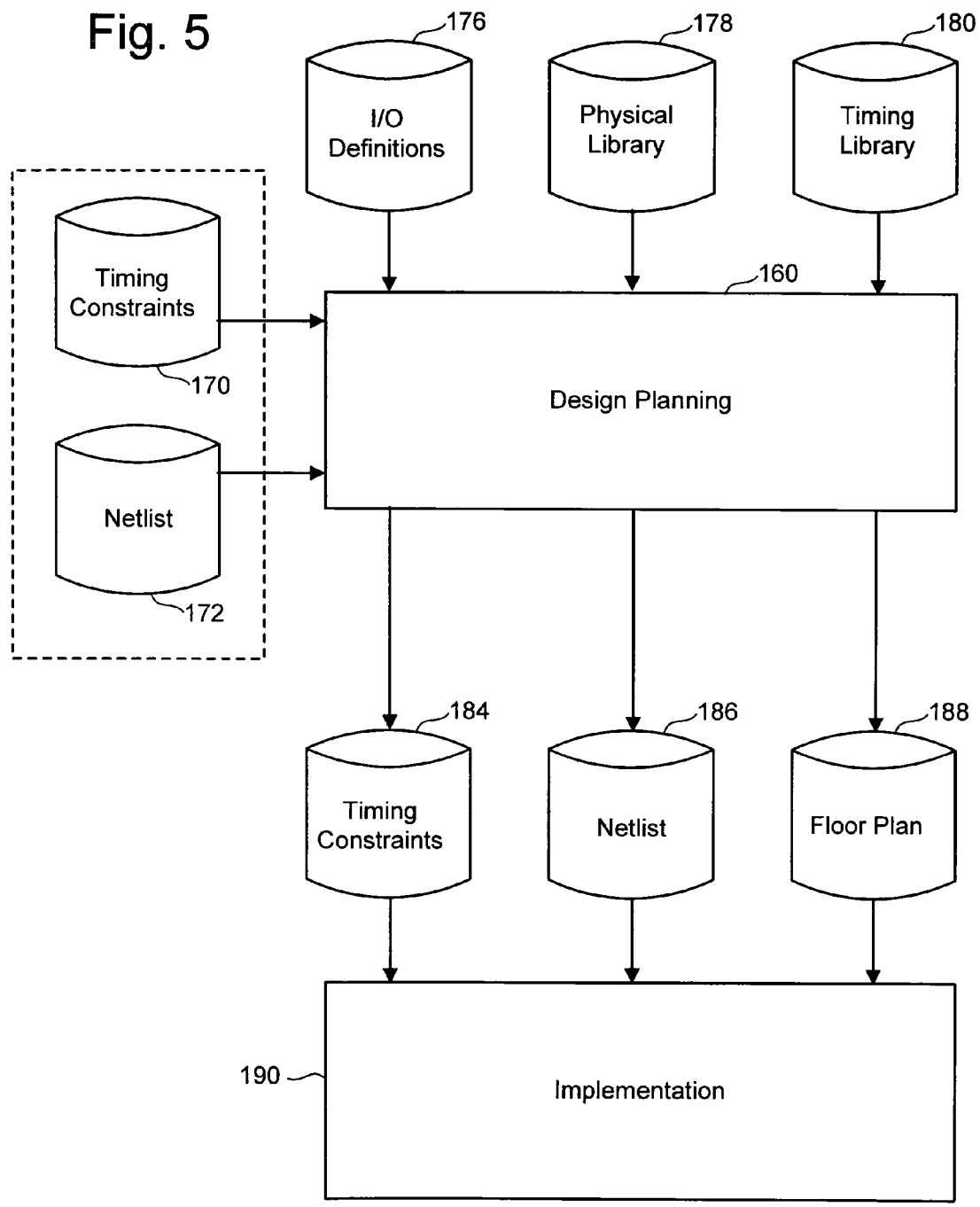
FIG. 5 is a block diagram of the design planning components.

FIG. 5 is a block diagram describing one embodiment of an interface for the software 160 for performing design planning. As described above, design planning can be implemented using software, hardware, or a combination of software and hardware. The results of logic synthesis step 62 includes providing timing constraints 170 and netlist 172, both of which are provided as inputs to design planning unit 160. Additional inputs also include I/O definitions 176, physical library 178 and timing library 180. I/O definitions 176 is a file that describes where one or more I/O pins should be placed, one or more hard macros should be placed (optional) and any other predefined placements specified by an engineer (or other entity). Physical library 178 is a library that describes the shape, size and pins of the standard cells of the design. Timing library 180 describes how fast or slow various components of the design operate. The output of design planning 160 includes timing constraints 184, updated netlist 186 and floor plan 188. Timing constraints 184 describe various timing constraints of the design. Netlist 186 is a modified version of netlist 172, according to the modifications described herein. Floor plan 188 provides an initial floor plan of where various components of the design will be placed.

Figure 6:
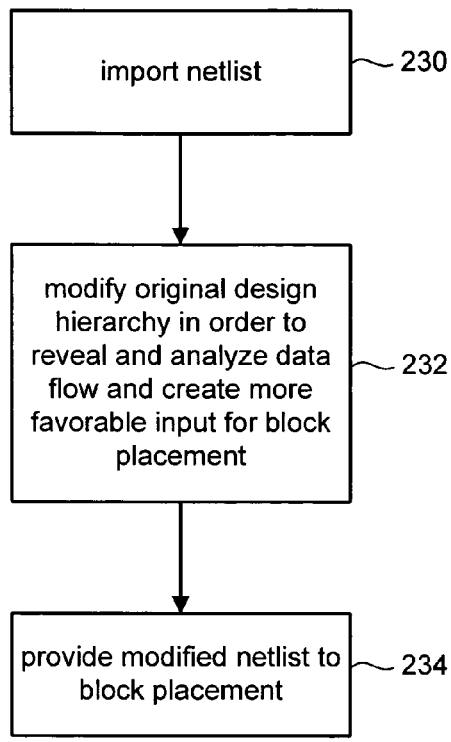
FIG. 6 is a flow chart describing one embodiment of a process for performing a design modification.

FIG. 6 is a flowchart describing more details of the step of the modifying design hierarchy (step 100 in FIG. 3). In step 230 of FIG. 6, the netlist is imported. For example, the netlist may be read from or otherwise accessed from memory, hard disk, other storage device, network, etc. In step 232, the original design hierarchy is modified in order to reveal and analyze data flow and create a more favorable input for block placement. Every design contains data flow, as represented by the original RTL description. In many design processes, the RTL design is used to create a hierarchical netlist. Typically, the data flow is not apparent in the hierarchical netlist. Thus, step 232 will include modifying the netlist (or other type of description of the design) to reveal all or a portion of the data flow of the design. This step restructures the hierarchy to bring out the data flow more clearly than the original hierarchy. In step 234, the modified netlist is provided to the block placement tool (see step 102 of FIG. 3).

Figure 7:
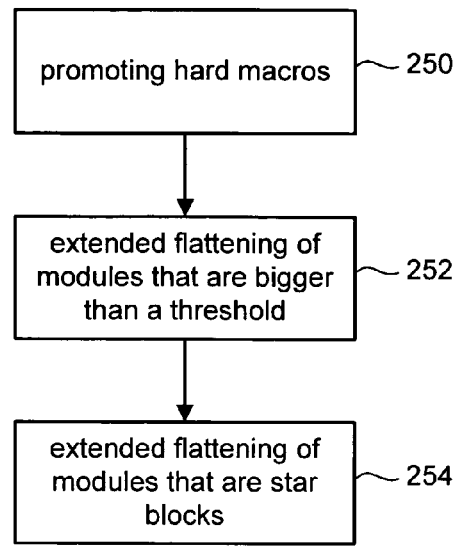
FIG. 7 is a flow chart describing one embodiment of a process for modifying a design hierarchy

FIG. 7 is a flowchart discovering one embodiment of the process for implementing the modifications of step 232 of FIG. 6. The process of FIG. 7 includes three sets of modifications; however, in other embodiments, less than all three sets of modifications can be used. Step 250 includes promoting hard macros. Step 252 includes performing extended flattening of modules that are bigger than a threshold. Step 254 includes performing extended flattening of modules that are star blocks. Each of these steps will be described in more detail below.

In one embodiment, one goal of step 232 is to flatten the netlist. As part of the flattening process, step 250 includes promoting all of the hard macros (which are in different levels of the hierarchy) to the top level of the hierarchy. In one implementation, step 250 is complete when all hard macros are at the top level of the hierarchy. Hard macros inside various modules of the hierarchy are not clustered with anything (in one example).

The process of performing the promotion of hard macros (step 250 of FIG. 7) is illustrated in the flowchart of FIG. 8. Starting from the lowest level of the hierarchy, the system will look to each module to determine if it has a hard macro. If a hard macro exists in a module, that module is flattened using an extended flattening process. As described above, modules in the hierarchy will have sub-modules. A module that has a sub-module is called the parent module for that sub-module. When a sub-module is determined to have a hard macro, the hard macro is then promoted to the parent module and various components of the sub-module are clustered together and added to the parent module according to the extended flattening process described herein.

In step 280 of FIG. 8, the process starts at the lowest level of the hierarchy. Step 282 includes determining which of all the modules at the current level being considered have hard macros within them. If there are any modules that have hard macros within and that have not been processed yet (step 284), then the system will perform an extended flattening process on one of the modules containing a hard macro, thereby promoting the hard macro to the next level up in the hierarchy. After step 286, the process moves back to step 284 to determine whether there are any more modules at the current level of hierarchy that have hard macros inside and that have not yet been processed. If so, step 286 is repeated for the next module meeting such criteria. If there are no more modules left to process at the current level of the hierarchy, then in step 290 it is determined whether the process is already at the top level of the hierarchy. If so, the process of FIG. 8 is complete and all hard macros should appear at the top level of the hierarchy. If the process is not already at the top level, then in step 292 the process moves up one level in the hierarchy and loops back to step 282. In step 282, the system will then determine all modules at the current level of the hierarchy that had hard macros inside and step 284 will be repeated.

Figure 9:
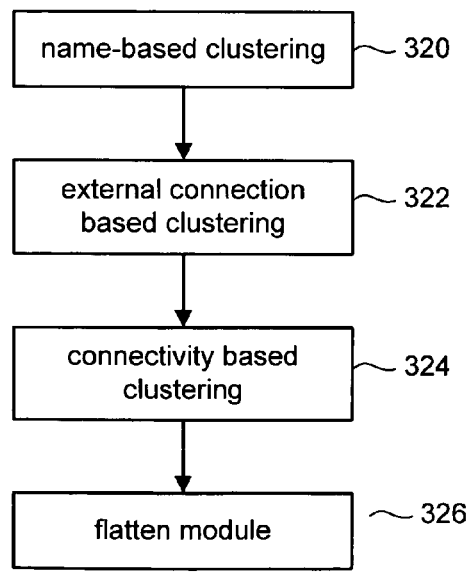
FIG. 9 is a flow chart describing one embodiment of a process of extended flattening.

FIG. 9 is a flowchart describing one embodiment of a process of performing extended flattening. In one embodiment, extended flattening includes removing boundaries of the module, clustering various components of the module and promoting hard macros and clusters to a parent module. In some embodiments, all standard cells inside a module are clustered before flattening the module. FIG. 9 shows four steps to the extended clustering process. In other embodiments, less than all four steps can be performed. In step 320, name-based clustering is performed. In step 322, external connection based clustering is performed. In step 324, a connectivity based clustering is performed. In step 326, after the clustering completed, the module is flattened. Note that in various embodiments, the order of the steps in FIG. 9 can be changed.

Name-based clustering (step 320 of FIG. 9) is a process for grouping together a set of components (e.g. gates or other components) based on name. Usually names of gates of the same original RTL module reflect the name of that RTL module. For example, each of the flip-flops of a register will have a similar name. Thus, it makes sense to group those flip-flops together to form a cluster. In one embodiment, flip-flops and latches are grouped together by name-based clustering. In other embodiments, other types of components can also be grouped together by name-based clustering. In one implementation, name-based clustering includes specifying a filter on instance-name to filter instances for clustering and allows creating multiple clusters simultaneously based on groupings of instances by common parts of their name. A typical filtering pattern will have the following structure:

<string>%s<string>%d<string>

The <string>s are static strings to match the cell names. The placeholder %s is used to group cells into clusters that have the same value for %s. The placeholder %d represents the variable part of the cell name; for example, it can pertain to a numeral. It is also possible to provide a comma separated list of patterns. Note that other forms of the filtering pattern can also be used to include less than the components mentioned above or additional components.

For example, assume that a module has the following flip-flops: add_reg[0], add_reg[1], add_reg[2], add_reg[3], sub_reg[0], sub_reg[1], . . . , sub_reg[7]. An engineer can provide the software implementing the present invention with a filter of the form "%s_reg[%d]." This filter has three <strings>: "_reg", "[" and "]." The name-based clustering process will then look for all registers and latches (or other components), which have a name that includes "_reg" followed by brackets with a number inside and another bracket. All registers and latches, which meet that pattern and have a common prefix (corresponding to %s) directly before the "_reg" will be grouped together. Thus, two groups or clusters will be created. The first cluster will include: add_reg[0], . . . , add_reg[3]. The second cluster will include sub_reg[0]sub_reg[7]. In one embodiment, the software will be given a command, which includes the pattern above and an additional pattern to name the instance created by the clusters and the blocks created by the cluster. For example, with the pattern described above, one potential instance name pattern could be "inst_%s" and one possible block name could include "block_% s." With the above example, two instances will be created: inst_add and inst_sub. The instance inst_add will correspond to block_add (add_reg [0], . . . , add_reg[3]) and inst_sub will correspond to block_sub (sub_reg[0], . . . , sub_reg[7].

External connection based clustering (see step 322 of FIG. 9] attempts to group together all those components that receive an external signal from the same source. That is, all components in a first module A that receive a signal from the same component in a different module B, will be grouped together to form a cluster. Alternatively, all components in module A that receive a signal from module B will be grouped together to form a cluster.

In one embodiment, external connection based clustering will first define a set of essential neighbors for a particular module. For a particular module, the system will determine how many signals that connect that module to all other modules in the same level of hierarchy. Then for all other modules in the same level of the hierarchy, the system will determine a strength of connection, which is a percentage equal to the number of signals to that module from the module A divided by the total number of external connections from module A. All modules having a strength of connection greater than a pre-defined number (e.g. 20%) will be considered an essential neighbor. Then, for each essential neighbor, one cluster inside module A will be created for all components that connect directly to the essential neighbor. The cluster will be created from standard cells which are connected to the corresponding essential neighbor through an external pin.

Step 324 of FIG. 9 includes connectivity-based clustering. This step is widely known in the art and includes grouping together components (e.g. gates) that are connected to each other or in close proximity to each other. In addition, in one embodiment, gates connected to a common hard macro can be clustered together and/or gates in proximity to a hard macro can be clustered together, and promoted with the hard macro.

The three clustering steps of FIG. 9 serve to group the various components of a module into a subset of components, each component of the subset includes multiple objects originally found in the module. After the clustering is performed, the module is flattened in step 326. Flattening is generally an operation of substituting a hierarchical module by its sets of sub-modules and restoring connectivity. In other words, boundaries of the module are removed along with pins. For each pin of the module, an external net to that pin is merged with the internal net connecting it to its sub-modules. One embodiment of the system will further remove loose logic that is not a part of the original RTM architecture, but serves other purposes. Such loose logic can include buffers, filler cells, etc. In one embodiment, the clustering and flattening seeks to preserve the original hierarchy by not clustering two instances from different branches of the design tree.

Figure 10A:
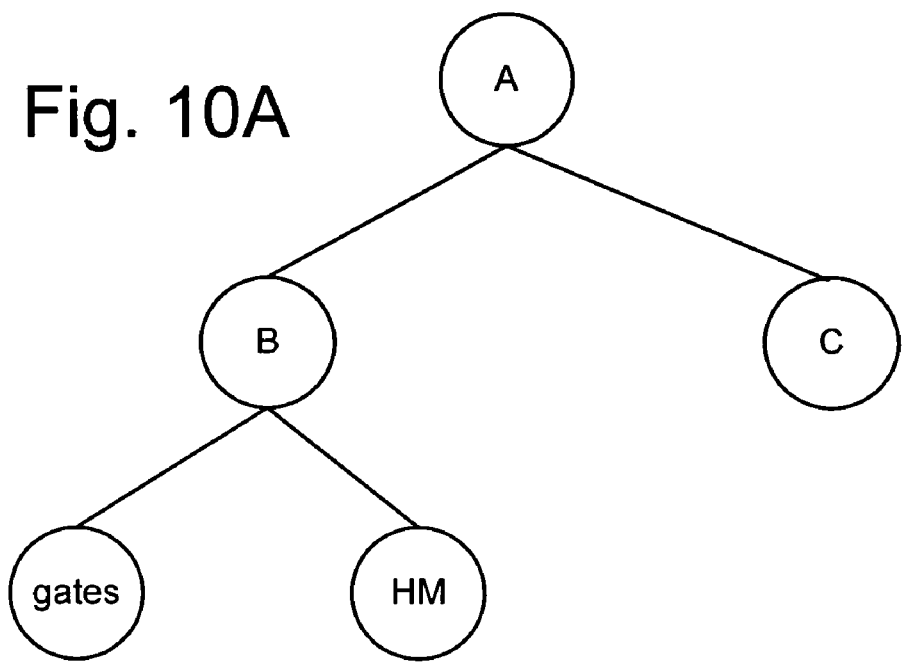
FIGS. 10A and 10B graphically depict a portion of a hierarchical description of a design.
Figure 10B:
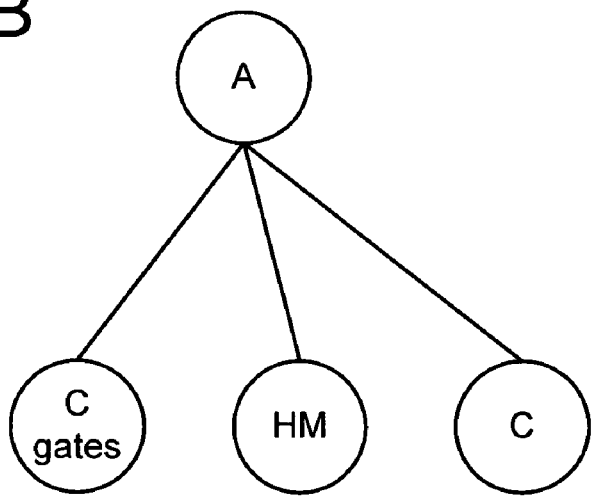

FIGS. 10A and 10B graphically depict a portion of a hierarchical description of a design. FIG. 10A shows a module A at the highest level of the portion of the hierarchy depicted in FIG. 10A. Module A has two sub-modules: module B and module C. Module B includes a set of gates and a hard macro HM. The process of FIG. 8 (which includes the extended flattening of FIG. 9) performs the various clustering steps of FIG. 9 to the gates, removes the boundary of module B and promotes the hard macro and the clustered gates (C gates) into the portion of the hierarchy previously held by module B. This result is shown in FIG. 10B, which illustrates the clustered gates (C gates) and the hard macro at the same level of the hierarchy as module C. Subsequent to B being flattened, module C would then be flattened (if necessary).

Figure 11:
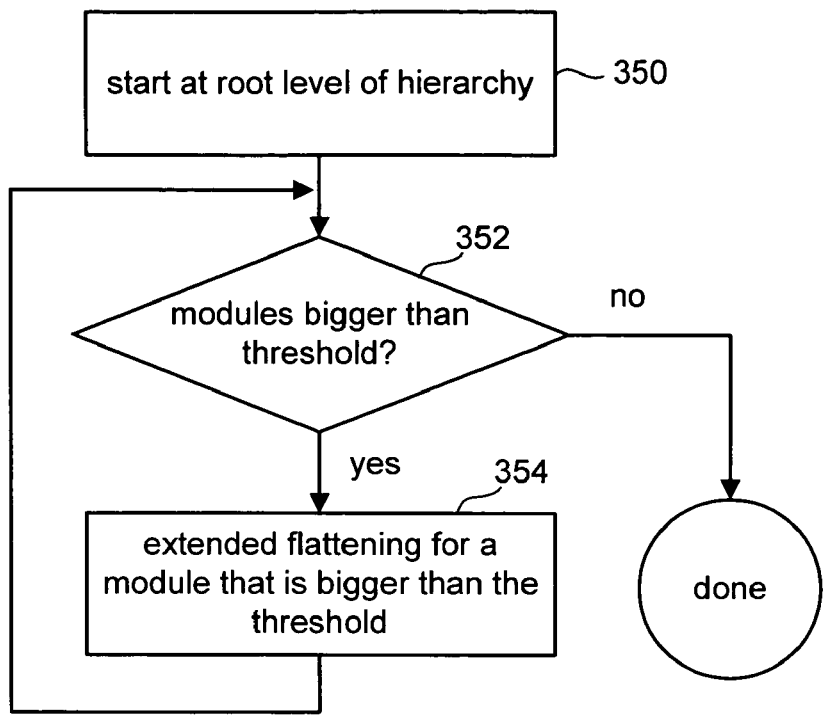
FIG. 11 is a flow chart describing one embodiment of a process for extended flattening of modules that are bigger than a threshold.

FIG. 11 is a flowchart describing one embodiment of a process for extended flattening of modules that are bigger than a threshold (step 252 of FIG. 7). That is, an engineer can indicate a threshold number of gates and any module that has more than that number of gates will be flattened. In one embodiment, the threshold is determined by dividing the total number of gates in the entire design by the number of objects that the placement tool can handle. For example, a typical number may have a threshold at 1,000 gates or 5,000 gates. Alternatively, the threshold could be based on memory usage or other metrics.

While the process of FIG. 8 described above with respect to promoting hard macros is performed in a bottom-up fashion, the process of FIG. 11 is performed in a top-down fashion. Thus, in step 350, the process starts at the root level of the hierarchy, which is the top level of the hierarchy. This module at the top level of the hierarchy corresponds to the design itself. The system then looks at every sub-module of the module to determine whether those sub-modules are bigger than the threshold value. If there are no modules bigger than the threshold value, then the process in FIG. 11 is completed. If there are modules that are bigger than the threshold value (step 352) than one of those modules are subjected to flattening in step 354. Step 354 includes performing the process of FIG. 9, which takes a module that is bigger than the threshold, clusters components inside according to steps 320-324 and flattens according to step 326. After step 354, the process loops back to step 352 and determines whether there are still any modules that are bigger than the threshold. If so, the process continues in step 354. If sub-modules are also bigger than a threshold, when those sub-modules are raised up to the current level of the hierarchy, they will trigger step 352 to continue finding a module greater than the threshold and will repeat step 354 for those sub-modules. This process will continue until there are no modules greater than the threshold.

Figure 12:
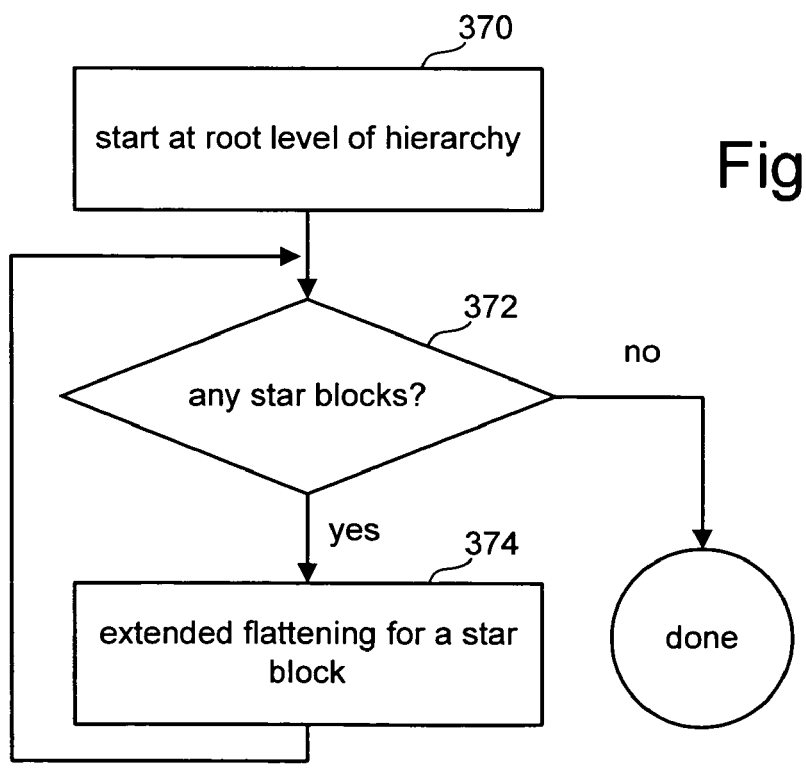
FIG. 12 is a flow chart describing one embodiment of a process for extended flattening of star blocks.

FIG. 12 is a flowchart describing one embodiment of a process for performing extending flattening of star blocks. Before describing the steps of FIG. 12, an explanation of a star block will be provided.

The strength of a connection of a given module to its neighbor is measured by the ratio of C/D, where C is the number of signals connecting the module to its neighbor and D is the total number of external signals of the module (fan-out of the module). Given a module M, sorts its neighbors in decreasing order of strength of connection to them. The first K most strongly connected neighbors of the module M are called Essential Neighbors of type 1. Here, K is a user-defined threshold and defaults to three. A star block of type 1 is a module which has more than P % of its connections to non-essential neighbors. In other words, add up all the connections to neighbors that are non-essential neighbors and divide that number by the total number of connections (fan-out). If that number is greater than P then the module is a star block of type 1. Here, P is a user-defined parameter, which in one embodiment, is equal to 50%. The reasoning is that if more than half of the nets of the module are connected to non-essential neighbors, then it is unlikely that the module is a leaf module of the registered transfer level description, unless the RTL description was poorly designed.

Another way of defining essential neighbors is using a notion of essential connections. If the strength of a connection of a given module of a neighbor is strictly greater than a user-specified threshold S, then the neighbor is called an Essential Neighbor of type 2. One example of the threshold S is 16%. A star block of type 2 is a module that has more than T essential neighbors of type 2. T can be a user of specified value. One example of a default value for T is 3. Thus, using example numbers given above, a star block is a module that has more than three neighbors each having greater than 16% of the connections from the module.

Pin density on a boundary of a module is defined as the ratio of U/P, where P is the perimeter of the shape of the module and U is the portion of the perimeter that is occupied by pins of the module. A star block of type 3 is defined as a block with pin density greater than the user-specified threshold (a default value is, for example, 80%).

Therefore, the above description contemplates three different types of star blocks. In one embodiment, the system will attempt to perform the function of flattening for any of the three types of star blocks. In other embodiments, less than all three types of star blocks can be identified for flattening. Note that the content of the star block is basically a module that is formed due to the hierarchical grouping of the netlist generation, but which does not accurately describe data flow of the design. Thus, the idea is to reveal the data flow by removing the star block.

FIG. 12 provides one example of a process for removing star blocks by performing extended flattening on such modules. Note that a module itself may be a star block or the module may include star blocks. Thus, a module that includes one star block could be a star block itself or could include one star block inside it. A module can include multiple star blocks inside it.

In step 370 of FIG. 12, the process starts at the root level of the hierarchy. Thus, the process of FIG. 12 is performed in a top-down manner. In step 372, it is determined whether there are any star blocks at the current level of the hierarchy. When at the root level, the system is looking at all the modules that are children of the root-level module. If any of those modules are star blocks, the process proceeds to step 374; otherwise, the process of FIG. 12 is completed. In step 374, one of the star blocks identified in step 372 is subject to extended flattening process of FIG. 9. After step 374 is performed, the process loops back to step 372 to determine whether there are any more star blocks. If so, the process continues at step 374.

In one alternative, a module will not be subjected to extended flattening, even if it is or has a star block within it, if the module is below a minimal threshold number of gates. In one example, such a minimum threshold could be 500 gates. In other embodiments, the minimum threshold can be user specified.

Figure 13A:
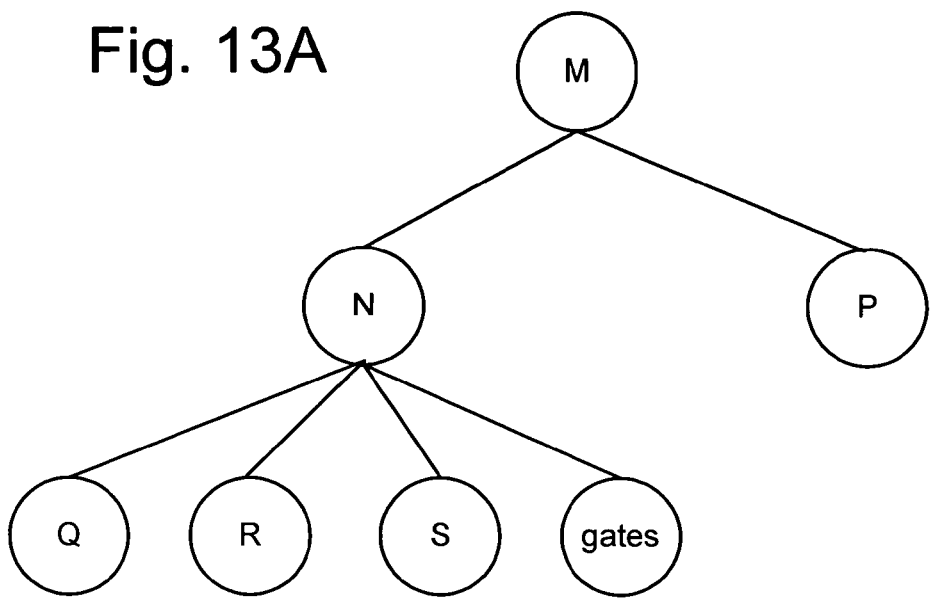
FIGS. 13A and 13B graphically depict a portion of a hierarchical description of a design.
Figure 13B:
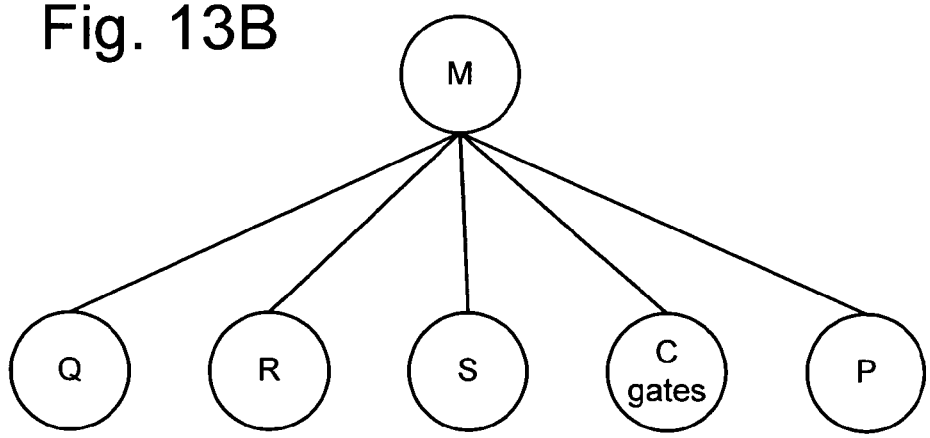

FIGS. 13A and 13B graphically depict a portion of a hierarchical description of a design and will be used to provide an example of the processes of FIGS. 11 and 12. FIG. 13 shows a module M having two children modules N and P. Module N has child node Q, child node R, child node S and gates. If node N is a star block, then node N will be flattened by clustering the gates, and moving sub-modules Q, R and S, and the gates (C gates—clustered as per the process of FIG. 9) into the same level as node P (see FIG. 13B). Alternatively, if node N is greater than the threshold (see FIG. 11), then node N will be flattened using the process of FIG. 9 in order to cluster its gates and raise the clustered gates (C gates), and sub-modules Q, R and S to the same level in the hierarchy as module P, as depicted in FIG. 13B.

Figure 14:
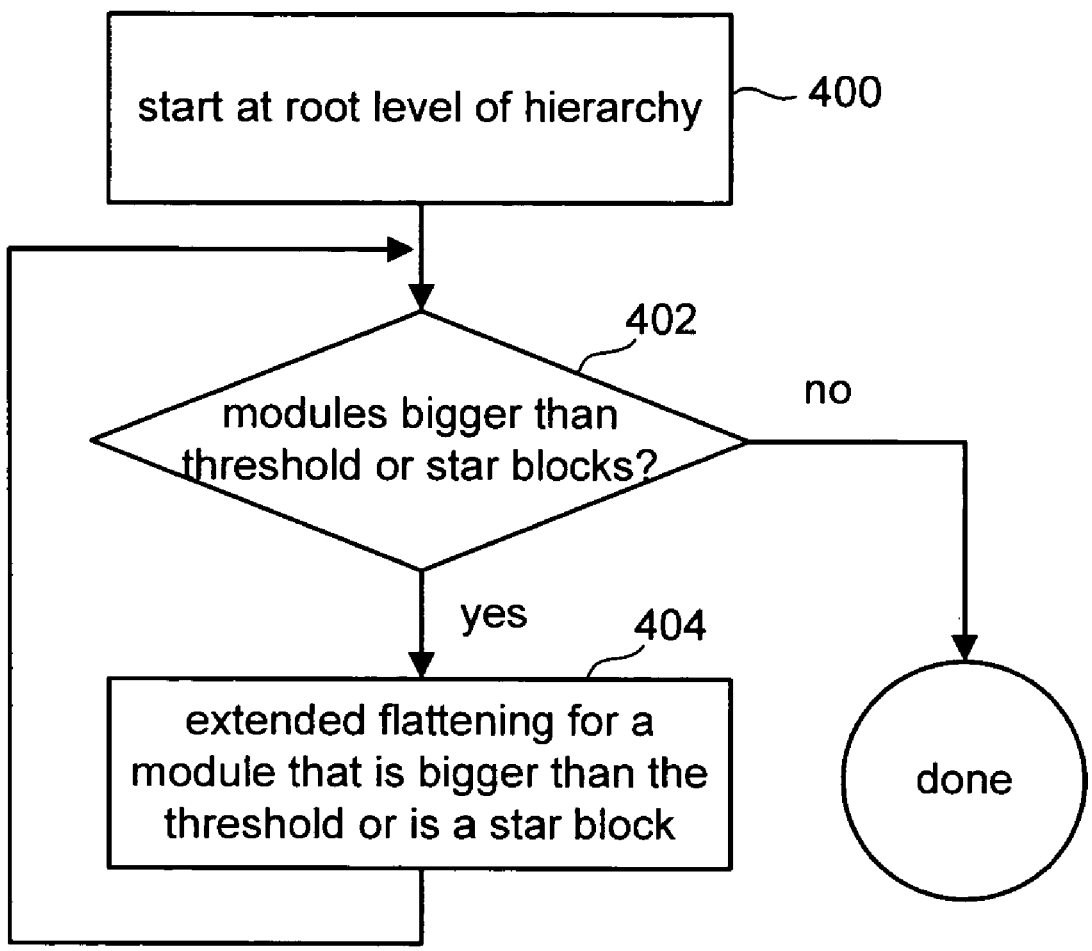
FIG. 14 is a flow chart describing one embodiment of a process for extended flattening of star blocks and modules that are bigger than a threshold.

FIG. 14 is a flowchart describing a process that combines the functions of FIGS. 11 and 12 so that extended flattening for star blocks and modules greater than the threshold are performed at the same time. In step 400, the process starts at the root level of the hierarchy. In step 402, it is determined whether any of the modules that are sub-modules of the root level are bigger than the threshold value or are star blocks (or include star blocks). If none of them are, the process of FIG. 14 is done. If any of the modules are star blocks or are bigger than the threshold, then one of those modules is subjected to the extended flattening process of FIG. 9 and the process moves back to step 402 so that any other modules that are star blocks or bigger than the threshold will also be subjected to the process of FIG. 9.

At the end of the process of FIG. 6, the modified netlist (as edited via the processes of FIGS. 7, 8, 9, 11, 12, and 14) is provided to a block placement tool. Because the netlist has been modified to reveal data flow, the block placement tool can be used to automatically place the hard macros as well as the various clusters. In prior art systems, a human engineer will manually place hard macros at the edges of the integrated circuit. Using the present invention, the entire design (including hard macros and cluster) can be placed by the automatic block placement tool. When the block placement tool automatically places both hard macros and clusters, the hard macros can be inter-dispersed within the design, being positioned in the interior of the design as well as near the edges.

Figure 15:
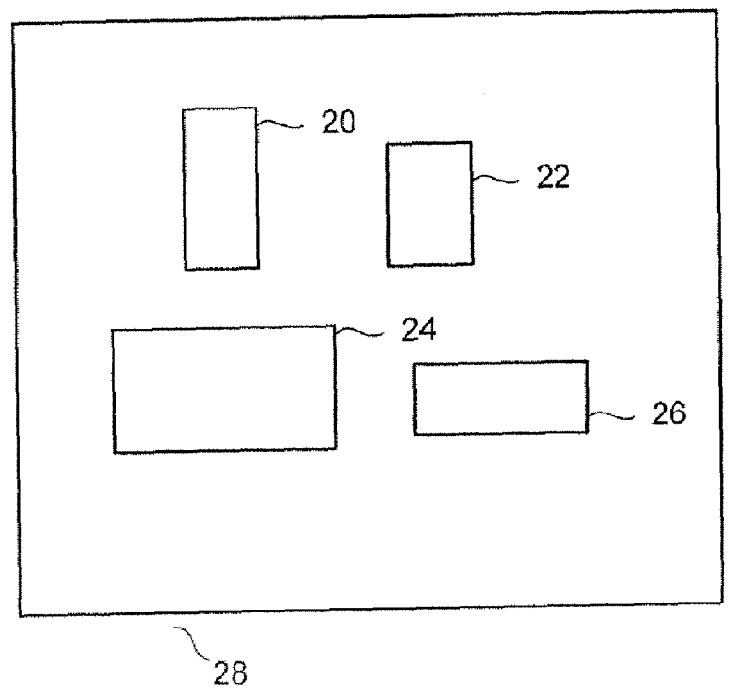
FIG. 15 depicts an example of an integrated circuit after automatic placement of hard macros, based on a description of a design modified in accordance with various embodiments of the present invention.

FIG. 15 shows the results of automatic block placement for hard macros using an automatic block placement tool (known in the art) in conjunction with a netlist modified using the current invention. The modified netlist creates a more favorable input for the block placement tool. Note that the processes for modifying the netlist can be used with many different block placement tools known to those skilled in the art. Thus, when comparing FIG. 15 to FIG. 1, FIG. 15 also shows hard macros 20, 22, 24 and 26 placed within the interior (e.g., center or other portion of the interior) of integrated circuit rather than all being placed at the edge 28.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of modifying a hierarchical description of a design including a plurality of modules at a plurality hierarchical levels, the method comprising:
   identifying each module of a lowest remaining level of the plurality hierarchical levels including a hard macro, wherein said each identified module is associated with a corresponding parent module at a next higher level of the plurality hierarchical levels;
   promoting said each identified module to said next higher level such that said corresponding parent module is replaced by a first module including solely said hard macro, and one or more second modules;
   repeating said identifying and said promoting until said first and second modules are in a highest level of the plurality hierarchical levels, and
   outputting the modified hierarchical description.

2. The method of claim 1, wherein promoting each identified module comprises clustering components associated with said hard macro in said second module.

3. The method of claim 2, wherein clustering said associated components in said second module comprises performing at least one of name-based clustering, external connection based clustering, and connectivity based clustering.

4. The method of claim 1,
   selecting a highest level of said plurality hierarchical levels;
   identifying each module of the hierarchical description at the selected level that is bigger than a threshold value;
   performing extended flattening for said each identified module by promoting all sub-modules associated with said each identified module from a next lower level of the plurality hierarchical levels to the selected level; and
   repeating said identifying and said extended flattening for each successively lower level of the plurality hierarchical levels until all modules of said hierarchical description are smaller than the threshold value.

5. The method of claim 1, further comprising:
   selecting a highest level of said plurality hierarchical levels;
   identifying each module of the hierarchical description at the selected level that comprises a star block having greater than a minimum number of associated gates;
   performing extended flattening for said each identified module by moving all sub-modules associated with said each identified module from a next lower level of the plurality hierarchical levels to the selected level; and
   repeating said identifying and said replacing for each successively lower level of the plurality hierarchical levels until all modules of said hierarchical description do not include star blocks.

6. The method of claim 1, further comprising:
   selecting a highest level of said plurality hierarchical levels;
   identifying each module of the hierarchical description at the selected level that is one of a) bigger than a threshold value, and b) comprising a star block having greater than a minimum number of associated gates;
   performing extended flattening for said each identified module by moving all sub-modules associated with said each identified module from a next lower level of the plurality hierarchical levels to the selected level, and
   repeating said identifying and said replacing for each successively lower level of the plurality hierarchical levels until all modules of said hierarchical description are smaller than the threshold value and do not include star blocks.

7. The method of claim 1, wherein said description is a netlist.

8. The method of claim 1, wherein software for performing said method is stored on one or more processor readable storage devices.

9. The method of claim 1, wherein said method is performed by an apparatus.

10. A method of designing an integrated circuit using one or more computing apparatus, the method comprising:
    generating a Register Level Transfer (RTL) design that describes the integrated circuit;
    performing logic synthesis on the RTL design to generate an hierarchical description of the integrated circuit, wherein the hierarchical description includes a plurality of modules arranged in a plurality of hierarchical levels;
    generating a modified hierarchical description including:
       identifying each module of a lowest remaining level of the plurality hierarchical levels including a hard macro, wherein said each identified module is associated with a corresponding parent module at a next higher level of the plurality hierarchical levels,
       promoting said each identified module to said next higher level such that said corresponding parent module is replaced by a first module including solely said hard macro, and one or more second modules and
       repeating said identifying and said promoting until said first and second modules are in a highest level of the plurality hierarchical levels; and
    placing and routing the modified hierarchical description to form a layout of the integrated circuit having a peripheral edge surrounding an interior region such that said hard macro is automatically placed in said interior region.

11. The method of claim 10, wherein promoting each identified module comprises clustering components associated with said hard macro in said second module.

12. The method of claim 11, wherein clustering said associated components in said second module comprises performing at least one of name-based clustering, external connection based clustering, and connectivity based clustering.

13. The method of claim 10,
    selecting a highest level of said plurality hierarchical levels;
    identifying each module of the hierarchical description at the selected level that is bigger than a threshold value;
    performing extended flattening for said each identified module by promoting all sub-modules associated with said each identified module from a next lower level of the plurality hierarchical levels to the selected level; and repeating said identifying and said extended flattening for each successively lower level of the plurality hierarchical levels until all modules of said hierarchical description are smaller than the threshold value.

14. The method of claim 10, further comprising:

selecting a highest level of said plurality hierarchical levels;

identifying each module of the hierarchical description at the selected level that comprises a star block having greater than a minimum number of associated gates;

performing extended flattening for said each identified module by moving all sub-modules associated with said each identified module from a next lower level of the plurality hierarchical levels to the selected level; and repeating said identifying and said replacing for each successively lower level of the plurality hierarchical levels until all modules of said hierarchical description do not include star blocks.

15. The method of claim 10, further comprising:

selecting a highest level of said plurality hierarchical levels;

identifying each module of the hierarchical description at the selected level that is one of a) bigger than a threshold value, and b) comprising a star block having greater than a minimum number of associated gates;

performing extended flattening for said each identified module by moving all sub-modules associated with said each identified module from a next lower level of the plurality hierarchical levels to the selected level, and repeating said identifying and said replacing for each successively lower level of the plurality hierarchical levels until all modules of said hierarchical description are smaller than the threshold value and do not include star blocks.

16. The method of claim 10, wherein said hierarchical description is a netlist.

17. The method of claim 10, wherein software for performing said method is stored on one or more processor readable storage devices.

18. The method of claim 10, wherein said method is performed by an apparatus.

19. A method of modifying a hierarchical description of a design including a plurality of modules at a first hierarchical level of the hierarchical description, wherein at least one module of said plurality of modules includes a plurality of sub-modules at a second hierarchical level of the hierarchical description, the method comprising:

identifying at least one module of said first plurality of modules that includes corresponding sub-modules at the second hierarchical level including a hard macro and a set of gates; and removing said at least one module from the first hierarchical level and promoting said hard macro and said set of gates to the first hierarchical level such that said plurality of modules includes a first module including solely said hard macro, and a second module including said set of gates, and outputting the modified hierarchical description.

20. The method of claim 19, wherein said hierarchical description is a netlist.

* * * * *